United States Patent
Chang

(10) Patent No.: US 9,450,544 B2
(45) Date of Patent: *Sep. 20, 2016

(54) PRE-DISTORTION METHOD, ASSOCIATED APPARATUS AND NON-TRANSITORY MACHINE READABLE MEDIUM

(71) Applicant: Realtek Semiconductor Corp., HsinChu (TW)

(72) Inventor: Yuan-Shuo Chang, Taoyuan County (TW)

(73) Assignee: Realtek Semiconductor Corp., HsinChu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/458,244

(22) Filed: Aug. 12, 2014

(65) Prior Publication Data

US 2015/0054585 A1 Feb. 26, 2015

(30) Foreign Application Priority Data

Aug. 20, 2013 (TW) .............................. 102129807 A

(51) Int. Cl.
*H04K 1/02* (2006.01)
*H03F 3/19* (2006.01)
*H03F 3/24* (2006.01)
*H03F 1/32* (2006.01)

(52) U.S. Cl.
CPC .............. *H03F 3/19* (2013.01); *H03F 1/3247* (2013.01); *H03F 1/3258* (2013.01); *H03F 3/245* (2013.01); *H03F 2200/451* (2013.01); *H03F 2201/3224* (2013.01); *H03F 2201/3233* (2013.01)

(58) Field of Classification Search
CPC ...................... H03F 1/3247; H03F 2201/3233; H03F 1/3241; H03F 2200/451; H03F 3/24; H03F 2201/3224; H03F 27/368; H03F 25/03343; H03F 27/367; H04B 2001/0425; H04B 1/0475

USPC ....... 375/296, 297, 295, 285, 219, 284, 346; 455/114.3, 63.1, 114.2, 522, 91
See application file for complete search history.

(56) References Cited

U.S. PATENT DOCUMENTS

2005/0116775 A1* 6/2005 McBeath .............. H03F 1/3241
 330/149
2013/0243123 A1* 9/2013 Bai ...................... H04L 27/367
 375/297

FOREIGN PATENT DOCUMENTS

EP 1 425 849 B1 6/2011

OTHER PUBLICATIONS

G. Montoro, "An LMS-Based Adaptive Predistorter for Cancelling Nonlinear Memory Effects in RF Power Amplifiers", Proceedings of Asia-Pacific Microwave Conference 2007.
Kim, IEEE Transactions on Microwave Theory and Techniques, vol. 54, No. 9, Sep. 2006, "Piecewise Pre-Equalized Linearization of the Wireless Transmitter With a Doherty Amplifier".

* cited by examiner

*Primary Examiner* — Leila Malek
(74) *Attorney, Agent, or Firm* — Winston Hsu; Scott Margo

(57) ABSTRACT

A pre-distortion method includes: receiving an input data; and obtaining a pre-distortion output by inputting the input data into a pre-distortion function, wherein the pre-distortion function is determined according to a following power amplifier; and multiplying a reciprocal of a pre-distortion ratio of the output of the power amplifier to the input data by the output of the power amplifier. A pre-distortion apparatus includes a receiver, a pre-distortion unit and a gain compensating unit. The receiver is utilized for receiving an input data. The pre-distortion unit is utilized for obtaining a pre-distortion output by inputting the input data into a pre-distortion function, wherein the pre-distortion function is determined according to a following power amplifier. The gain compensating unit is utilized for multiplying a reciprocal of a pre-distortion ratio of the output of the power amplifier to the input data by the output of the power amplifier.

36 Claims, 12 Drawing Sheets

PRE-DISTORTION METHOD, ASSOCIATED APPARATUS AND NON-TRANSITORY MACHINE READABLE MEDIUM

BACKGROUND OF THE INVENTION

1. Field of the Invention

The disclosed embodiments of the present invention relate to a calibration method for a communication system, associated circuits and a non-transitory machine readable medium, and more particularly, to a pre-distortion method for compensating a power amplifier of a radio frequency (RF) circuit having non-linear characteristics and/or memory effect, an associated apparatus and a non-transitory machine readable medium.

2. Description of the Prior Art

Spectral efficiency is becoming a more significant issue in the field of mobile communication as a result of wider bandwidth requirements along with rapid development of the technology. In a complex non-constant envelope modulation, circuit designers have to grasp characteristics of a power amplifier employed in an RF circuit due to high peak-to-power ratio (PAPR). FIG. 1 is a diagram illustrating a transmitter of a conventional wireless communication system. Non-linear characteristics of a power amplifier 104 may produce amplitude modulation-amplitude modulation (AM-AM) distortion and amplitude modulation-phase modulation (AM-PM) distortion at an output terminal. The distortion becomes worse as the bandwidth becomes wider, which causes out-of-band spectral re-growth and in-band distortion effects. Eventually, the error vector magnitude (EVM) may be degraded. In addition, the output of the power amplifier 104 may be affected by past input, which is known as the memory effect. The memory effect deteriorates as the bandwidth becomes higher. A conventional pre-distortion circuit 102 cannot handle the non-linear characteristics/memory effect of the baseband circuit, and therefore may have difficulty satisfying requirements of modern wireless communication systems.

SUMMARY OF THE INVENTION

According to the disclosed embodiments of the present invention, a pre-distortion method for compensating a power amplifier of a radio frequency (RF) circuit which has non-linear characteristics and/or memory effect, an associated apparatus and a non-transitory machine readable medium are disclosed to improve the aforementioned issues.

According to an exemplary embodiment of the present invention, a pre-distortion method is disclosed. The pre-distortion method comprises: receiving an input data; obtaining a pre-distorted output by inputting the input data into a pre-distortion function, wherein the pre-distortion function is determined according to a following power amplifier; and obtaining a pre-distortion ratio of an output of the power amplifier to the input data, and multiplying a reciprocal of the pre-distortion ratio with the output of the power amplifier.

According to another exemplary embodiment of the present invention, a pre-distortion apparatus is disclosed. The pre-distortion apparatus comprises a receiving unit, a pre-distortion unit and a gain compensation unit. The receiving unit is arranged for receiving an input data. The pre-distortion unit is arranged for obtaining a pre-distorted output by inputting the input data into a pre-distortion function, wherein the pre-distortion function is determined according to a following power amplifier and obtaining a pre-distortion ratio of an output of the power amplifier to the input data. The gain compensation unit is arranged for multiplying a reciprocal of the pre-distortion ratio with the output of the power amplifier.

According to still another exemplary embodiment of the present invention, a non-transitory machine readable medium is disclosed. The non-transitory machine readable medium stores a program code, wherein when executed by a processor, the program code enables the processor to perform a pre-distortion method, the method comprising: receiving an input data; obtaining a pre-distorted output by inputting the input data into a pre-distortion function, wherein the pre-distortion function is determined according to a following power amplifier; and obtaining a pre-distortion ratio of an output of the power amplifier to the input data and, and multiplying a reciprocal of the pre-distortion ratio with the output of the power amplifier.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
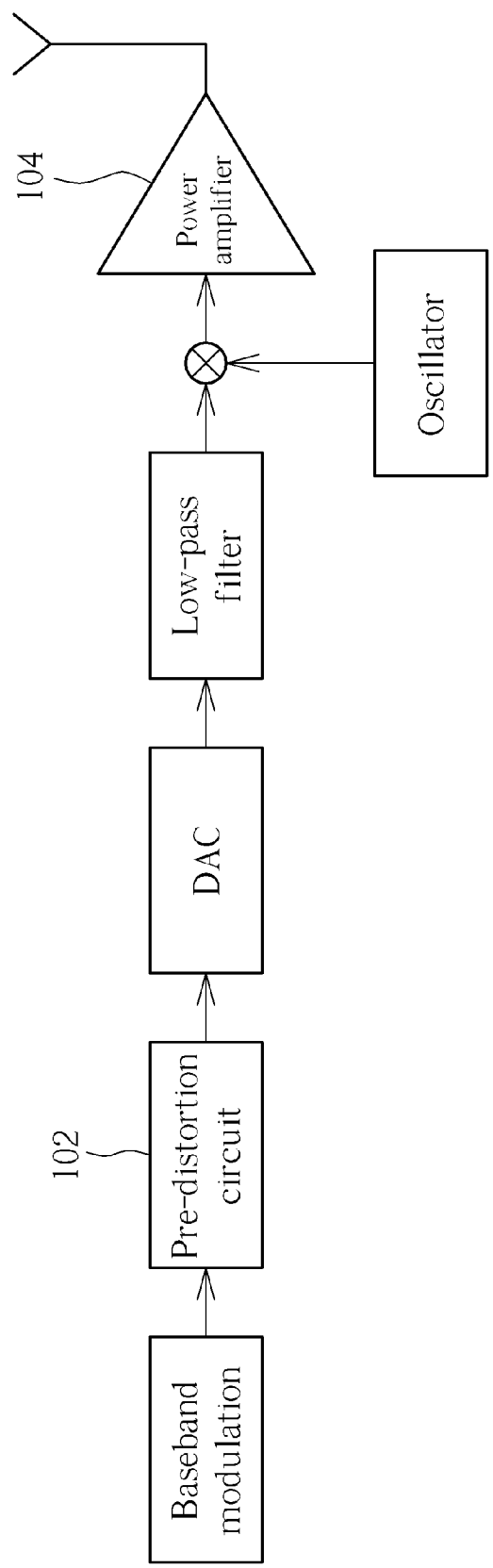
FIG. 1 is a diagram illustrating a transmitter of a conventional wireless communication system.

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "coupled" is intended to mean either an indirect or direct electrical connection. Accordingly, if one device is coupled to another device, that connection may be through a direct electrical connection, or through an indirect electrical connection via other devices and connections.

The main objective of the present invention is to mitigate or cancel non-linear characteristics and/or the memory effect. In other words, unwanted characteristics will be cancelled so that only linear characteristics of the power amplifier are preserved in a preferred embodiment. Regarding architectures employed by the disclosed embodiments of the present invention, signals pass an inversed function of a non-linear function and/or memory function of a power amplifier in a radio frequency (RF) circuit before the signals are injected into the power amplifier. The non-linear characteristics and/or the memory effect can then be perfectly cancelled after the signals pass through the power amplifier and the gain compensation unit.

For enhancing understanding of the concept of the disclosed pre-distortion method, deduction of mathematical formulas is presented as follows. First of all, it is required to build a model for a power amplifier in an RF circuit. There are many ways to express the characteristic function of a general power amplifier of an RF circuit. The non-linear characteristic may be expressed in the form of a memory polynomial (MP), which is simple and easy to understand. The difference between a modeling result and behavior in the real world is not highly significant although the memory polynomial of the non-linear characteristic is a simplified function. The error caused by the use of the memory polynomial is generally acceptable. A power amplifier can be expressed as the following function in the form of a memory polynomial:

$$y(n) = \sum_{i=0}^{M} \sum_{\substack{j=0 \\ j=\text{even}}}^{p} C_{i,j} x(n-i) |x(n-i)|^j \quad (1)$$

In equation (1), y(n) is a power amplifier output of the power amplifier, and x(n) is a power amplifier input of the power amplifier. Further, M denotes a memory depth of the power amplifier, and p denotes a polynomial order of the power amplifier.

In order to not excessively degrade accuracy according to behavior of a power amplifier in practice, only even terms of the memory polynomial of the power amplifier are retained, as shown in equation (1). Based on the above assumptions, equation (1) can be expanded and reformed.

$$y(n) = \sum_{i=0}^{M} x(n-i) \sum_{\substack{j=0 \\ j \text{ is even}}}^{p} C_{i,j} |x(n-i)|^j = \sum_{i=0}^{M} x(n-i) d_i \quad (2)$$

Where $$d_i = \sum_{\substack{j=0 \\ j \text{ is even}}}^{p} C_{i,j} |x(n-i)|^j \quad (3)$$

Where $d_i$ is regarded as a time-variant coefficient; the power amplifier can be regarded as a time-variant filter (i.e. a filter comprising time-variant tap coefficient) according to equation (2) derived from the memory polynomial of the power amplifier. The order of the memory polynomial of the power amplifier may be 4, and the memory depth may be 2, i.e. p=4 and M=2, which means the power amplifier output y(n) is not only influenced by the current power amplifier input x(n), but is also influenced by a power amplifier input x(n−1) of one previous time unit and a power amplifier input x(n−2) of two previous time units. When p=4 and M=2, equation (3) can be rewritten as equation (4).

$$\begin{aligned} y(n) &= C_{0,0}x(n) + C_{0,2}x(n)|x(n)|^2 + C_{0,4}x(n)|x(n)|^4 + C_{1,0}x(n-1) + \\ &\quad C_{1,2}x(n-1)|x(n-1)|^2 + C_{1,4}x(n-1)|x(n-1)|^4 + C_{2,0}x(n-2) + \\ &\quad C_{2,2}x(n-2)|x(n-2)|^2 + C_{2,4}x(n-2)|x(n-2)|^4 \\ &= x(n)d_0 + x(n-1)d_1 + x(n-2)d_2 \end{aligned} \quad (4)$$

Equation (5) shows filter tap coefficients $d_0$, $d_1$, $d_2$.

$$d_0 = C_{0,0} + C_{0,2}|x(n)|^2 + C_{0,4}|x(n)|^4$$

$$d_1 = C_{1,0} + C_{1,2}|x(n-1)|^2 + C_{1,4}|x(n-1)|^4$$

$$d_2 = C_{2,0} + C_{2,2}|x(n-2)|^2 + C_{2,4}|x(n-2)|^4 \quad (5)$$

The simplified time-variant filter derived from the power amplifier possesses coefficients $d_0$, $d_1$, $d_2$, wherein $d_0$ is a function of $|x(n)|^2$, $d_1$ is a function of $|x(n-1)|^2$, and $d_2$ is a function of $|x(n-2)|^2$. It should be noted that the size of the order of the memory polynomial of the power amplifier and the size of the memory depth mentioned above are for illustrative purposes only. The present invention is also applicable to a power amplifier having a memory polynomial of other polynomial order or memory depth.

Figure 2:
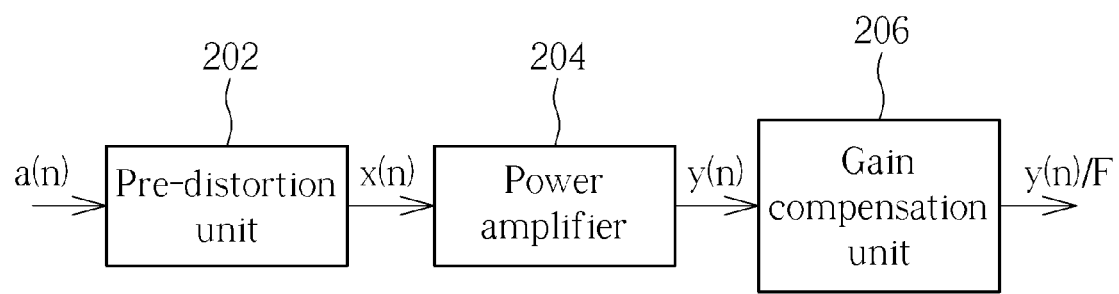
FIG. 2 is a diagram illustrating a pre-distortion model of the present invention.

A detailed description of how to utilize the above equations to further obtain a desired pre-distortion function is given in the following. This is the main purpose of the present invention. FIG. 2 is a diagram illustrating a pre-distortion model of the present invention. The pre-distortion model includes a pre-distortion unit 202, a power amplifier 204 and a gain compensation unit 206. At time n, a(n) is a pre-distorted input of the pre-distortion unit 202, and x(n) is a pre-distorted output of the pre-distortion unit 202, i.e. an input of the power amplifier 204. y(n) is a power amplifier output of the power amplifier 204, and y(n)/F is a gain compensation output of the gain compensation unit 206, wherein F is a pre-distortion ratio. Suppose y(n)=a(n) F, then the output of the gain compensation unit 206 can be found to be a(n), i.e. y(n)/F=a(n), which means that an inverse function of the function of the power amplifier 204 can be obtained by employing the function of the pre-distortion unit 202 and the function of the gain compensation unit 206. That is, the pre-distortion unit 202 along with the gain compensation unit 206 perfectly offset the non-linear characteristics and/or the memory effect of the power amplifier 204. Equation (6) can be derived based on equation (2).

$$x(n) = \frac{1}{d_0}\left[a(n)F - \sum_{i=1}^{M} x(n-i)d_i\right] \quad (6)$$

In other words, the pre-distortion unit 202 has to comply with the equation (6), so as to make the function of the pre-distortion unit 202 become the inverse function of the function of the power amplifier 204.

Equation (7) can be further derived by squaring equation (6) based on a given condition that $|a(n)|^2=|x(n)|^2$.

$$|x(n)|^2 = \left|\frac{1}{d_0}\left[a(n)F - \sum_{i=1}^{M} x(n-i)d_i\right]\right|^2 = |a(n)|^2 \quad (7)$$

Please note that, although the disclosed embodiment is for dealing with an Orthogonal Frequency Division Multiplexing (OFDM) signal, and a(n), x(n−i), and $d_i$ are all complex numbers, the purpose of the pre-distortion ratio F is used for making the square value of $(a(n)F - \Sigma_{i=1}^{M} x(n-1)d_i)$ equal the square value of $a(n)d_0$ such that the power of the pre-distortion unit output, i.e. $|x(n)|^2$, is equal to the power of the pre-distortion unit input, i.e. $|a(n)|^2$, and the pre-distortion ratio F may be a real number. If $a(n)=p+qi$, and $$\left(-\sum_{i=1}^{M} x(n-1)d_1\right) = s + ti = G,$$

equation (8) can be obtained based on equation (7).

$$|(p+qi)F+(s+ti)|^2 = |a(n)d_0|^2 = E \quad (8)$$

where p, q, s, t, E are real numbers. After further simplification, equation (9) is obtained.

$$|(pF+s)+(qF+t)i|^2 = E \quad (9)$$

and $$(pF+s)^2+(qF+t)^2 = E \quad (10)$$

Hence, $$(p^2+q^2)F^2+2(ps+qt)F+(s^2+t^2) = E \quad (11)$$

Equation (12) can be obtained through the following deduction.

$$F = \frac{-2(ps+qt) \pm \sqrt{\frac{(2(ps+qt))^2 -}{4(p^2+q^2)(s^2+t^2-E)}}}{2(p^2+q^2)} \quad (12)$$

$$= \frac{-2(ps+qt) \pm \sqrt{\frac{4(p^2s^2+q^2t^2+2psqt) -}{4(p^2+q^2)(s^2+t^2)+4(p^2+q^2)E}}}{2(p^2+q^2)}$$

$$= \frac{-2(ps+qt) \pm \sqrt{\frac{4p^2s^2+4q^2t^2+8psqt-4p^2s^2-4p^2t^2 -}{4q^2s^2-4q^2t^2+4(p^2+q^2)E}}}{2(p^2+q^2)}$$

$$= \frac{-2(ps+qt) \pm \sqrt{\frac{8psqt-4p^2t^2 -}{4q^2s^2+4(p^2+q^2)E}}}{2(p^2+q^2)}$$

$$= \frac{-2(ps+qt) \pm \sqrt{4(p^2+q^2)E - 4(\text{pt}-qs)^2}}{2(p^2+q^2)}$$

$$= \frac{-2(ps+qt) \pm 2\sqrt{|a(n)|^2 E - (pt-qs)^2}}{2|a(n)|^2},$$

therefore $$F = \frac{-\text{Re}\left(a(n)\left(\sum_{i=1}^{M} x(n-i)(-d_i)\right)^*\right) \pm}{\sqrt{|a(n)|^2 E - \left(-\text{Im}\left(a(n)\left(\sum_{i=1}^{M} x(n-i)(-d_i)\right)^*\right)\right)^2}}{|a(n)|^2}$$

where ps+qt is a real part of a product of a(n) and the complex conjugate of G, and ps−qt is a negative number of an imaginary part of the product of a(n) and the complex conjugate of G. Equation (13) can be obtained by taking a positive result of $$F = \frac{-\text{Re}(a(n)G^*) \pm \sqrt{|a(n)|^2 E - (\text{Im}(a(n)G^*))^2}}{|a(n)|^2}. \quad (13)$$

$$F = \frac{-\text{Re}(a(n)G^*) + \sqrt{|a(n)|^2 E - (\text{Im}(a(n)G^*))^2}}{|a(n)|^2}$$

where Re(a(n)G*) denotes a real part of a(n)G*, and Im(a(n)G*) denotes an imaginary part of a(n)G*.

At time n, the pre-distortion unit 202 can obtain the pre-distorted input a(n) directly; and the pre-distorted output x(n−i) before the time n is given, wherein i=1, 2, ..., M. For example, x(n−i) can be stored in advance for further usage at time n. As for $d_i$, the adaptive algorithm can be utilized to respectively obtain and store corresponding $d_i$ with respect to different x(n−i). For instance, $d_i$ may be stored in a look-up table. In this way, $d_i$ corresponding to time n can be determined according to x(n−i). On the other hand, at time n, albeit x(n) is unknown, however, $|x(n)|^2$ can be given in advance before x(n) is produced by the pre-distortion unit, according to the equation (7), since we already have $|a(n)|^2$, the square value of the pre-distortion input, at the time n. It is also feasible to compute $d_0^2$ corresponding to different $|x(n)|^2$ in advance by utilizing an adaptive algorithm, and the derived $d_0^2$ can be stored in a look-up table so that F of equation (13) and x(n) of equation (6) can be instantly calculated in real-time. The pre-distortion output x(n) of the pre-distortion unit 202 can thereby be obtained. The details of building the look-up tables by using the adaptive algorithm will be described in the following paragraphs.

Figure 3:
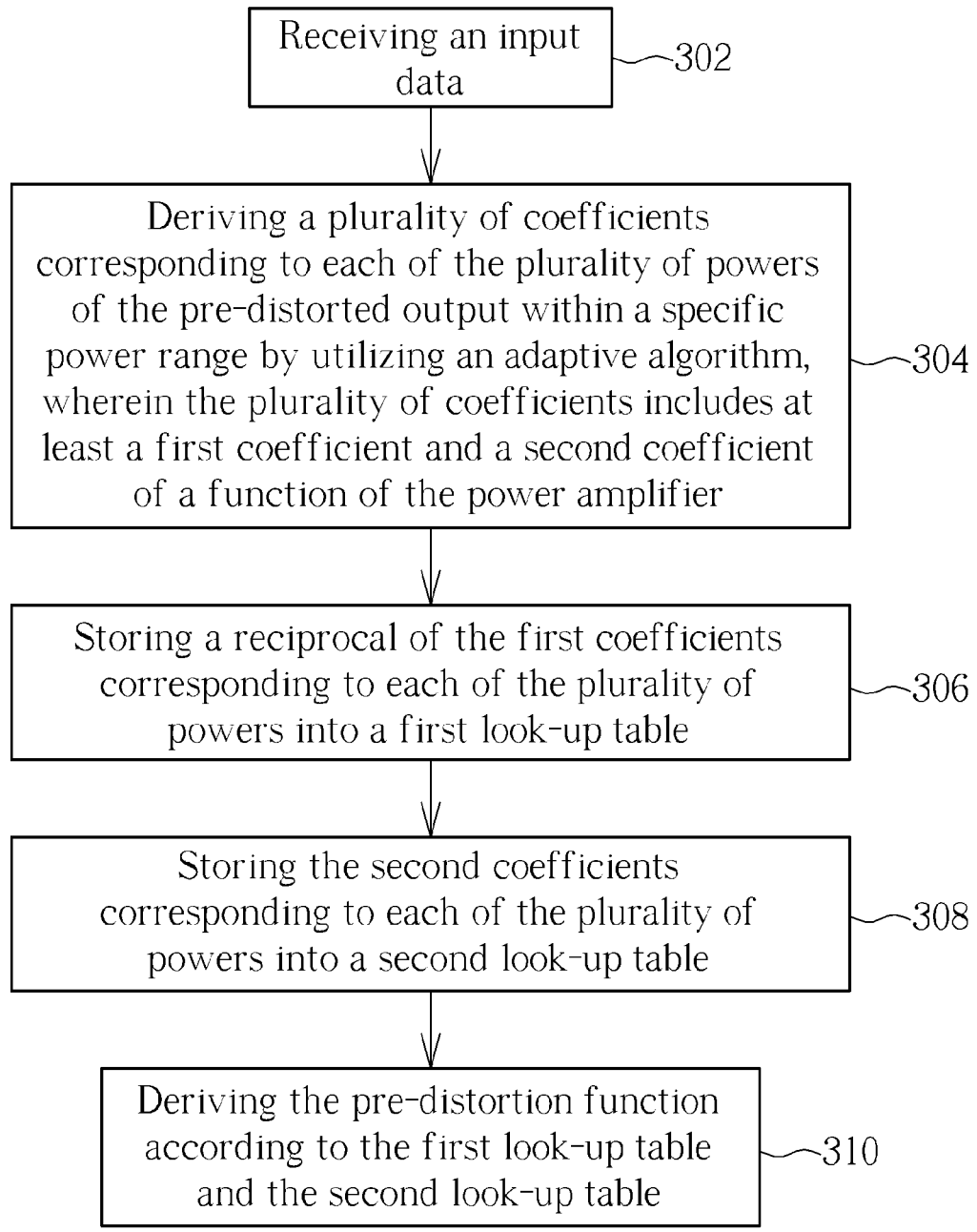
FIG. 3 is a flowchart illustrating a pre-distortion method according to an exemplary embodiment of the present invention.

FIG. 3 is a flowchart illustrating a pre-distortion method according to an exemplary embodiment of the present invention. Provided that substantially the same result is achieved, the steps in FIG. 3 need not be in the exact order shown and need not be contiguous; that is, other steps can be intermediate. Some steps in FIG. 3 may be omitted according to various embodiments or requirements. Details of the pre-distortion method are described as follows.

Step 302: receiving an input data;

Step 304: deriving a plurality of coefficients corresponding to each of the plurality of powers of the pre-distorted output within a specific power range by utilizing an adaptive algorithm, wherein the plurality of coefficients includes at least a first coefficient and a second coefficient of a function of the power amplifier;

Step 306: storing a reciprocal of the first coefficients corresponding to each of the plurality of powers into a first look-up table;

Step 308: storing the second coefficients corresponding to each of the plurality of powers into a second look-up table; and Step 310: deriving the pre-distortion function according to the first look-up table and the second look-up table.

Figure 4:
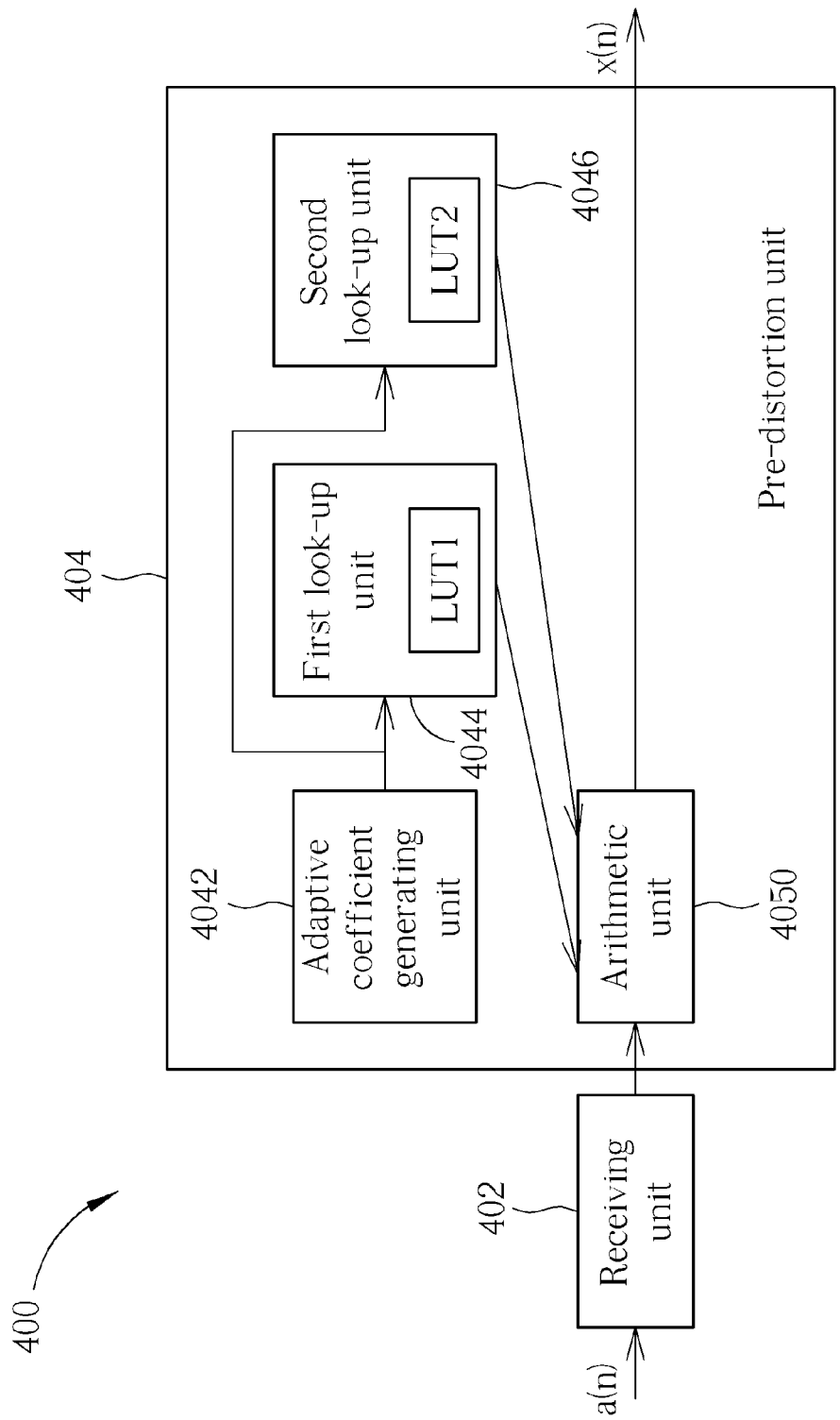
FIG. 4 is a diagram illustrating a pre-distortion apparatus according to an exemplary embodiment of the present invention.

FIG. 4 is a diagram illustrating a pre-distortion apparatus according to an exemplary embodiment of the present invention. The pre-distortion apparatus 400 includes at least one portion (e.g. a portion or all) of an electronic device, wherein the electronic device includes at least a transmission circuit and a receiving circuit. For example, the pre-distortion apparatus 400 may comprise a portion of the electronic device mentioned above, and more particularly, can be a control circuit such as an integrated circuit (IC) within the electronic device. In another example, the pre-distortion apparatus 400 can be the entire electronic device mentioned above. Examples of the electronic device may include, but are not limited to, a mobile phone (e.g. a multifunctional mobile phone), a mobile computer (e.g. tablet computer), a personal digital assistant (PDA), and a personal computer such as a laptop computer. The pre-distortion apparatus 400 may be a process module of the electronic device, such as a processor. In another example, the pre-distortion apparatus 400 may be the entire electronic device; however, this is for illustrative purposes, and not a limitation of the present invention. According to an alternative design of the present invention, the pre-distortion apparatus 400 is a system of the electronic device, and the electronic device is a sub-system of the system. More particularly, the electronic device may include an Orthogonal Frequency Division Multiplexing (OFDM) circuit, wherein the pre-distortion apparatus 400 is able to compensate the non-linear characteristics of a power amplifier of said OFDM circuit.

As shown in FIG. 4, the pre-distortion apparatus 400 includes a receiving unit 402 and a pre-distortion unit 404. The receiving unit 402 is used for executing step 302, i.e. receiving an input data a(n), wherein n denotes a discrete time of a digital signal process. In this embodiment, the input data a(n) is an OFDM data produced by an OFDM process, wherein the OFDM process is widely applied in communication systems, especially in wireless communication systems. It should be noted, however, that the present invention is not limited to wireless communication systems or OFDM systems. Alternative designs applied in the same or similar communication systems which comply with the spirit of the present invention also fall within the scope of the present invention. The pre-distortion unit 404 includes an adaptive coefficient generating unit 4042, a first look-up unit 4044, a second look-up unit 4046 and an arithmetic unit 4050. Please note that the modules mentioned in this embodiment are denoted as general purpose, and the specific implementation of each module will be given in embodiments detailed in the following paragraphs. For simplifying the complexity of each embodiment, an order of a memory polynomial of a target power amplifier that the pre-distortion unit 404 deals with is 2, and a memory depth is 1; in other words, for equation (1), (2) and (3), p=2 and M=1. The size of the order of the memory polynomial of the power amplifier and the size of the memory depth mentioned above is for illustrative purposes only, however.

In FIG. 4, after the receiving unit 402 transmits the input data a(n) to the pre-distortion unit 404, the input data a(n) goes through a pre-distortion function of the pre-distortion unit 404 and a pre-distorted output x(n) can be obtained. In this embodiment, the pre-distortion process is the exact content of equation (6).

In the next step, by referring to the descriptions regarding the look-up tables mentioned above, the corresponding $d_i$ for different x(n−i) can be respectively obtained and stored by the adaptive algorithm. Then, the corresponding $d_i$ can be selected according to x(n−i) at time n. Further, by referring to equation (5), it is given that $d_i$ is a function of $|x(n-i)|^2$, wherein x(n−i) is actually composed of an in-phase component and a quadrature-phase component, and $|x(n-i)|^2$ can be regarded as a power of x(n−i). Before the pre-distortion unit 404 begins to process the input data a(n) (which will be specifically presented in the following paragraphs), in step 304 of this embodiment, coefficients $d_0$ and $d_1$ corresponding to each of the plurality of power levels of the pre-distorted outputs x(n) and x(n−1) within a specific power level range are calculated in advance by utilizing an adaptive algorithm performed by the adaptive coefficient generating unit 4042. That is, by using the adaptive algorithm performed by the adaptive coefficient generating unit 4042, different $|x(n)|^2$ within the specific power level range and corresponding $d_0$ can be calculated respectively in advance; and different $|x(n-1)|^2$ within the specific power level range and corresponding $d_1$ can be calculated respectively in advance as well. For example, the adaptive algorithm may be a least mean square (LMS) algorithm. The present invention is not limited to the LMS algorithm, however. The specific power level range indicates the operational power level range for normal operation of the power amplifier in practice, i.e. the power level range of signals produced by the power amplifier in normal cases. Since it is required to store a limited number of data within a reasonable range as much as possible, a preferred arrangement of the plurality of power levels within the specific power level range in this embodiment is assigned according to the non-linear characteristics of the power amplifier. Please note that the arrangement of the plurality of power levels within the specific power level range is not limited to this method. For example, it is feasible to bisect the specific power level range into 10 equal parts and calculate coefficients corresponding to the 10 different power levels.

After step 304, the plurality of calculated $|x(n)|^2$ within the specific power level range and the plurality of reciprocals of the corresponding $d_o$ are to be stored in a first look-up table LUT1 for $1/d_0$ of equation (6) in the subsequent step. In step 308, the plurality of calculated $|x(n-1)|^2$ within the specific power level range and the plurality of corresponding $d_1$ are to be stored in a second look-up table LUT2 for $d_i$ of equation (6) (i=1) in the subsequent step. Then, the pre-distortion function can be derived according to the first look-up table LUT1 and the second look-up table LUT2 in step 310.

Figure 5:
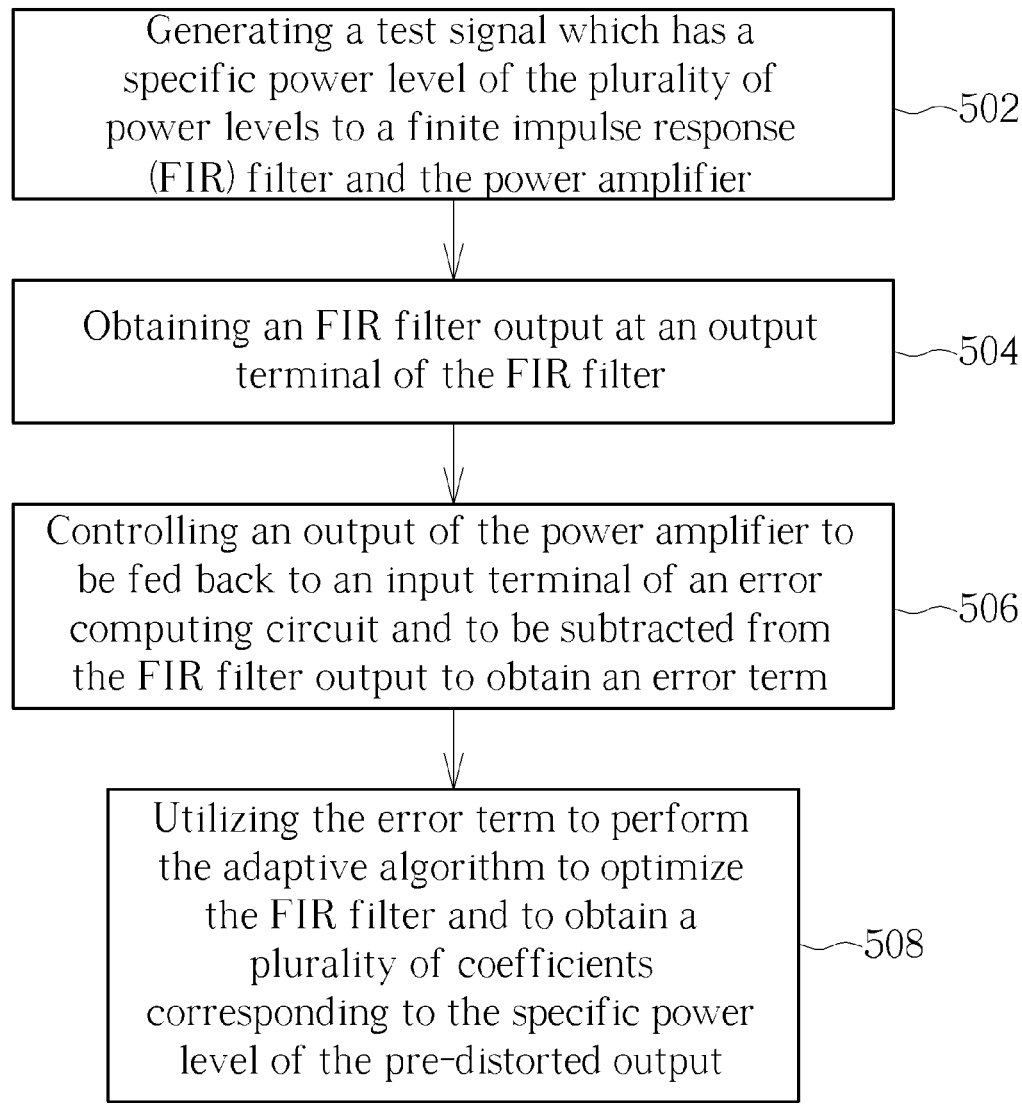
FIG. 5 is a flowchart illustrating a step of deriving a plurality of coefficients by utilizing an adaptive algorithm according to an exemplary embodiment of the present invention.

Details of step 304 are given in the following. FIG. 5 is a flowchart illustrating a step of deriving a plurality of coefficients by utilizing an adaptive algorithm according to an exemplary embodiment of the present invention. Provided that substantially the same result is achieved, the steps in FIG. 5 need not be in the exact order shown and need not be contiguous; that is, other steps can be intermediate. Some steps in FIG. 5 may be omitted according to various embodiments or requirements. Details of the method are described as follows.

Step 502: generating a test signal which has a specific power level of the plurality of power levels to a finite impulse response (FIR) filter and the power amplifier;

Step 504: obtaining an FIR filter output at an output terminal of the FIR filter;

Step 506: controlling an output of the power amplifier to be fed back to an input terminal of an error computing circuit and to be subtracted from the FIR filter output to obtain an error term; and Step 508: utilizing the error term to perform the adaptive algorithm to optimize the FIR filter and to obtain a plurality of coefficients corresponding to the specific power level of the pre-distorted output.

Figure 6:
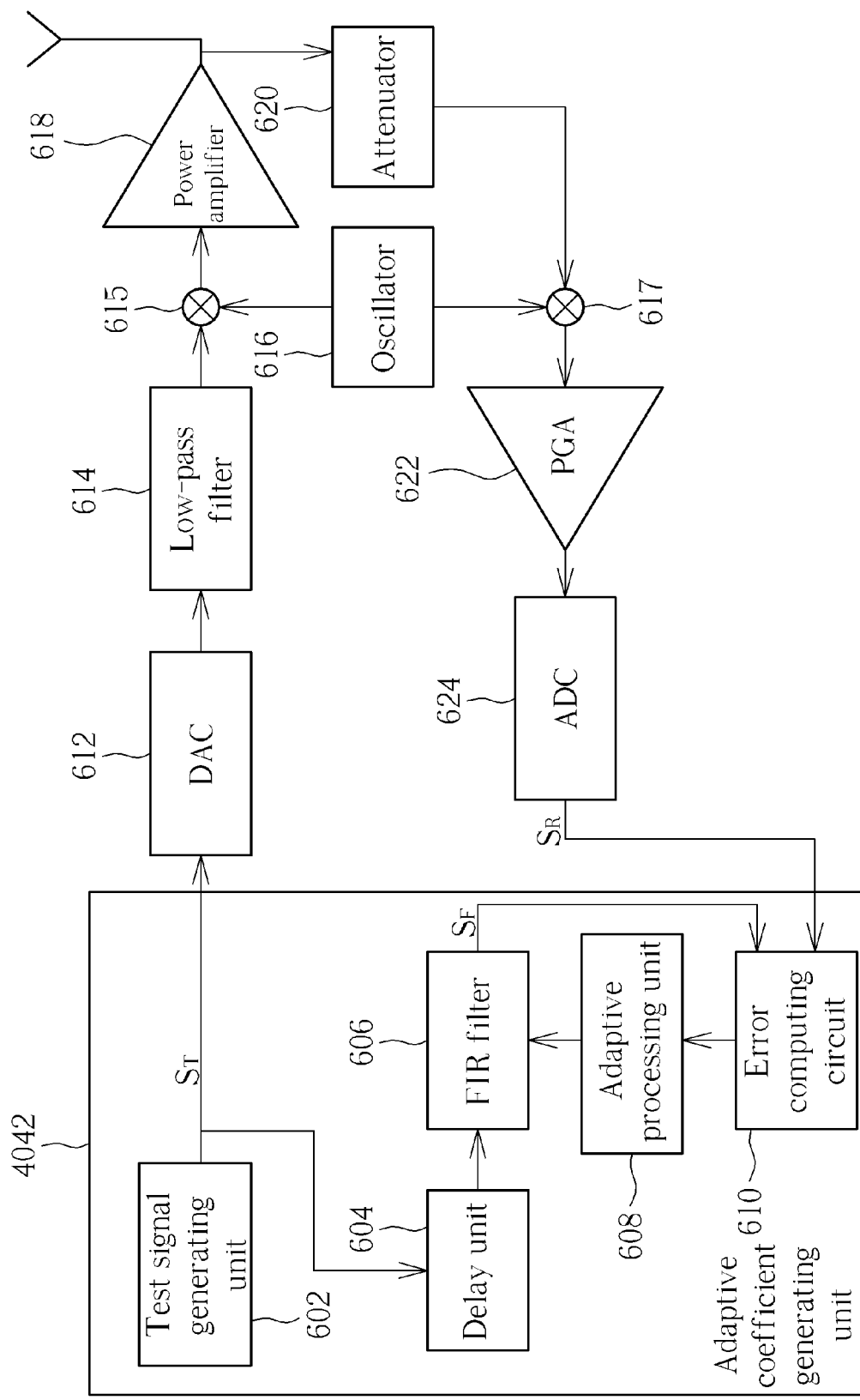
FIG. 6 is a diagram illustrating the adaptive coefficient generating unit of the pre-distortion apparatus according to an exemplary embodiment of the present invention.

FIG. 6 is a diagram illustrating the adaptive coefficient generating unit 4042 of the pre-distortion apparatus 400 according to an exemplary embodiment of the present invention. As shown in FIG. 6, the adaptive coefficient generating unit 4042 includes a test signal generating unit 602, a delay unit 604, an FIR filter 606, an adaptive processing unit 608 and an error computing circuit 610. In addition, FIG. 6 further includes a transmission circuit and a receiving circuit of a communication system to which this embodiment is applied. These circuits may comprise a digital-to-analog converter 612, a low-pass filter 614, an oscillator 616, a power amplifier 618, an attenuator 620, a programmable gain amplifier (PGA) 622, an analog-to-digital converter 624, a mixer 615 and a mixer 617. It should be noted that said transmission circuit and said receiving circuit are for illustrative purposes only, and not limitations of the present invention. In other words, the present invention can be applied to other communication systems with alternative architectures, which also falls within the scope of the present invention.

In step 502, the test signal generating unit 602 of the adaptive coefficient generating unit 4042 is utilized to produce the plurality of test signals corresponding to the plurality of power levels mentioned in step 304, wherein the test signal corresponding to each power level is used for the adaptive coefficient generating process. For instance, five different power levels may be selected within the specific power level range, and the test signal generating unit 602 generates five corresponding test signals according to these five different power levels respectively. The adaptive coefficient generating process is performed with respect to one of the five different test signals by the following circuit, and then the adaptive coefficient generating process is performed with respect to one of the rest of the test signals and so on, until the adaptive coefficient generating process is completed with respect to all of the five different test signals. Since a pre-distortion circuit which can compensate the power amplifier 618 in the normal operation mode is desired, the bandwidth of each test signal produced by the test signal generating unit 602 should be close to the actual bandwidth of the data signal processed by the power amplifier 618 in the normal operation mode in practice. In other words, making the characteristics of the test signal close to the characteristics of the real data signal of the power amplifier 618 is essential. For example, contents of the test signal may be pseudo random. This is for illustrative purposes, however, and not a limitation of the present invention. Moreover, in this embodiment, a summation of a square value of an in-phase component of the test signal and a square value of a quadrature-phase component of the test signal should be a constant as a result of the specific power level of the test signals being a fixed value.

Figure 7:
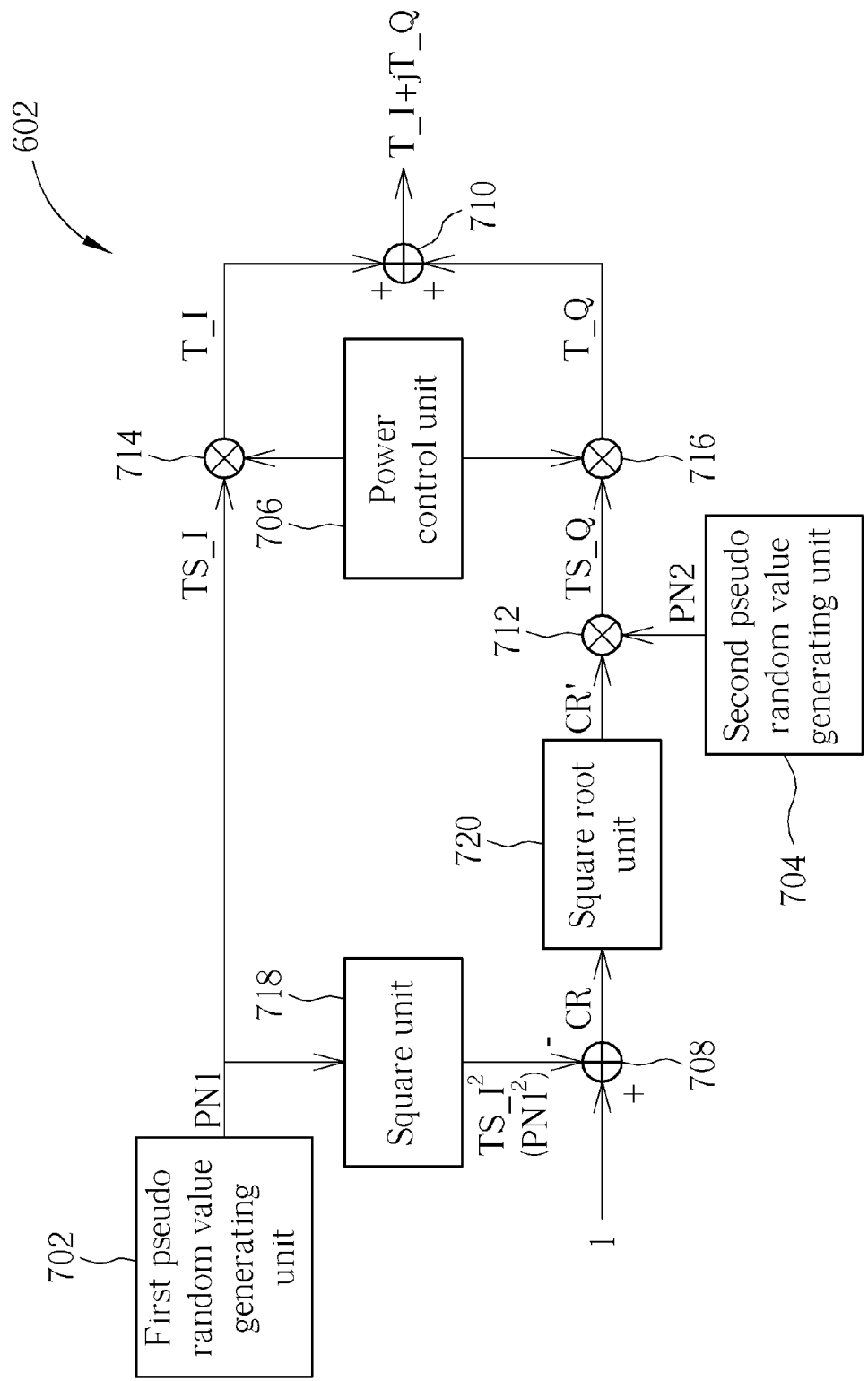
FIG. 7 is a diagram illustrating the test signal generating unit of the adaptive coefficient generating unit of the pre-distortion apparatus according to an exemplary embodiment of the present invention.

With regard to the generation of test signals by the test signal generating unit 602, please refer to FIG. 7. FIG. 7 is a diagram illustrating the test signal generating unit 602 of the adaptive coefficient generating unit 4042 of the pre-distortion apparatus 400 according to an exemplary embodiment of the present invention. The test signal generating unit 602 includes a first pseudo random value generating unit 702, a second pseudo random value generating unit 704, a power control unit 706, a plurality of adders 708, 710, a plurality of multipliers 712, 714, 716, a square unit 718 and a square root unit 720. The first pseudo random value generating unit 702 is utilized to produce random values PN1 within −1 and 1, and outputs an in-phase test signal component TS_I. The square unit 718 then performs a square operation upon the in-phase test signal component TS_I (i.e. PN1) to obtain a square value. The negative value of the square value is added by 1 by the adder 708 to produce a calculation result CR. The square root of the calculation result CR is then derived by the square root unit 720 and outputted as a calculation result CR'. The second pseudo random value generating unit 704 randomly selects 1 or −1 as a selection result PN2, and the selection result PN2 is outputted and multiplied by the calculation result CR' to generate a quadrature-phase test signal component TS_Q. The power control unit 706 adjusts the in-phase test signal component TS_I and the quadrature-phase test signal component TS_Q according to the specific power level of the test signal which is currently desired, so as to further produce a power level adjusted in-phase test signal component T_I and a power level adjusted quadrature-phase test signal component T_Q. The power level adjusted in-phase test signal component T_I and the power level adjusted quadrature-phase test signal component T_Q are merged into one signal and outputted as T_I+j*T_Q.

Next, specific descriptions regarding step 504-508 are given with respect to coefficient generation of one of the plurality of power levels. Please refer to FIG. 6 again. After the test signal generating unit 602 of the adaptive coefficient generating unit 4042 generates a specific power level test signal $S_T$ (e.g. T_I+j*T_Q mentioned above), the specific power level test signal $S_T$ is sent to following two different circuit blocks, respectively. One of the circuit blocks transforms the specific power level test signal $S_T$ to the analog domain by the digital-to-analog converter 612, and then processed by the low-pass filter 614 to generate filtered analog signal. Next, the mixer 615 translates the filtered analog signal to a radio frequency by mixing the filtered analog signal with a high-frequency carrier from oscillator 616. The mixed signal is then transmitted to the power amplifier 618, and rather than being sent out by the antenna, the amplified signal is fed back directly to the attenuator 620 of the receiving circuit via an internal loopback path. The received signal is down-converted from the high frequency carrier, and after the PGA 622, the signal is converted to the digital domain by the analog-to-digital converter 624, wherein the digitized signal is denoted as a feedback test signal $S_R$. The other circuit block transmits the specific power level test signal $S_T$ to the FIR filter 606 and produces an FIR filter output $S_F$, and then an error Err between the FIR filter output $S_F$ and the sfeedback test signal $S_R$ is calculated by the error computing circuit 610.

It should be noted that the feedback test signal $S_R$ and the FIR filter output $S_F$ may be asynchronous when arriving the error computing circuit 610 as a result of the feedback path delay. The delay unit 604 is therefore added into another path depending on design considerations. For example, in the course of transmitting the specific power level test signal $S_T$ to the FIR filter 606, the delay unit 604 is employed to deliberately delay the transmission for a specific time unit to make the FIR filter output $S_F$ synchronous with the feedback test signal $S_R$. Next, the error Err is transmitted to the adaptive processing unit 608 for adjusting tap coefficients of the FIR filter 606 in accordance with the error Err and the tap coefficients of the FIR filter 616 are adjusted by the adaptive processing unit 608 until the error Err is converged to a minimum value which cannot be further reduced. To put in other words, the plurality of coefficients corresponding to the specific power level of the pre-distorted output will be obtained when the tap coefficients of the FIR filter 606 is optimized, wherein the optimized result may differ from different adaptive algorithms.

Figure 8:
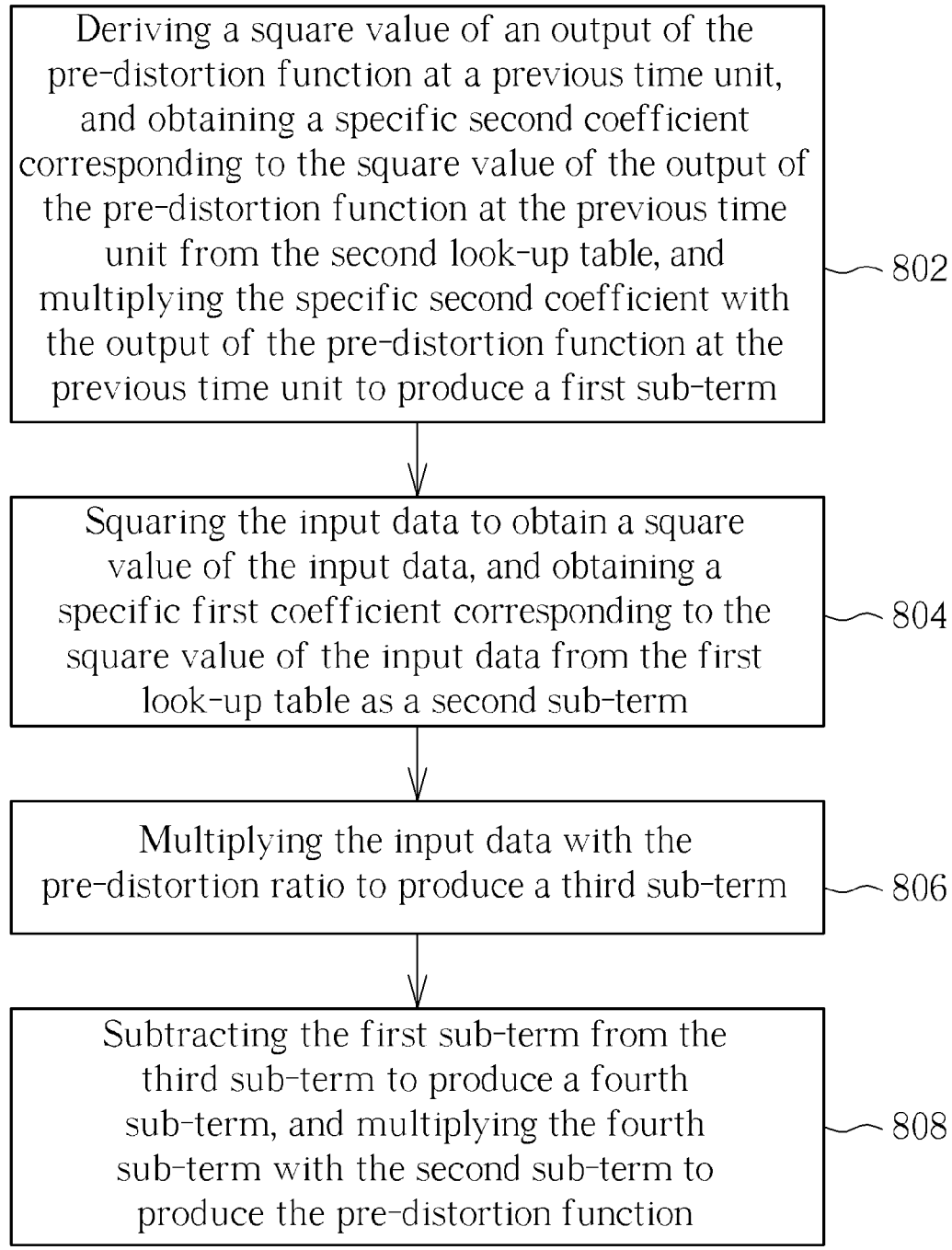
FIG. 8 is a flowchart illustrating a step of deriving a pre-distortion function in accordance with a first look-up table and a second look-up table according to an exemplary embodiment of the present invention.

FIG. 8 is a flowchart illustrating a step of deriving a pre-distortion function in accordance with a first look-up table and a second look-up table according to an exemplary embodiment of the present invention. Provided that substantially the same result is achieved, the steps in FIG. 8 need not be in the exact order shown and need not be contiguous; that is, other steps can be intermediate. Some steps in FIG. 8 may be omitted according to various embodiments or requirements. Details of the method are described as follows.

Step 802: deriving a square value of an output of the pre-distortion function at a previous time unit, and obtaining a specific second coefficient corresponding to the square value of the output of the pre-distortion function at the previous time unit from the second look-up table, and multiplying the specific second coefficient with the output of the pre-distortion function at the previous time unit to produce a first sub-term;

Step 804: squaring the input data to obtain a square value of the input data, and obtaining a specific first coefficient corresponding to the square value of the input data from the first look-up table as a second sub-term;

Step 806: multiplying the input data with the pre-distortion ratio to produce a third sub-term; and Step 808: subtracting the first sub-term from the third sub-term to produce a fourth sub-term, and multiplying the fourth sub-term with the second sub-term to produce the pre-distortion function.

Figure 9:
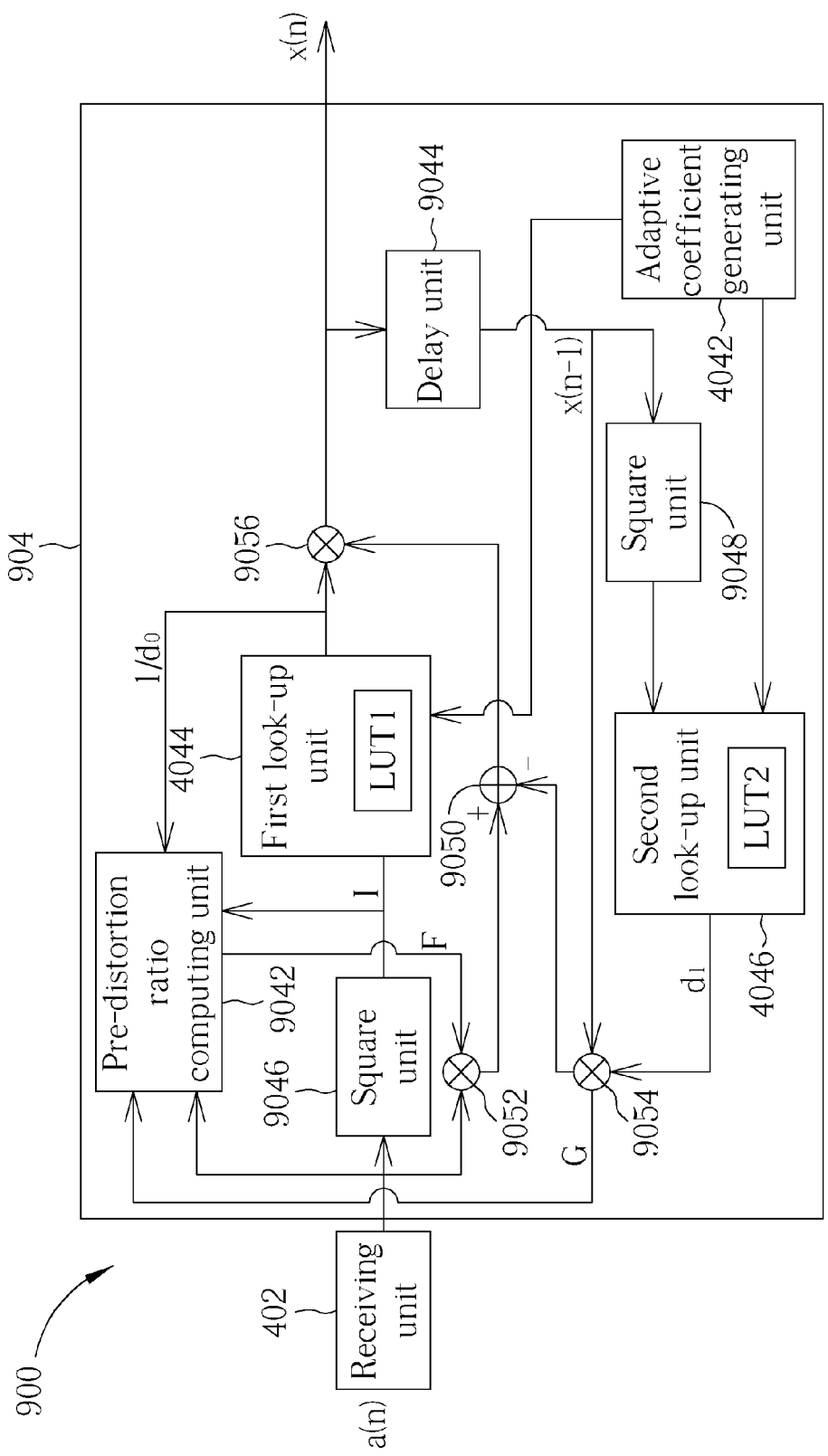
FIG. 9 is a diagram illustrating a pre-distortion apparatus according to another exemplary embodiment of the present invention.

Please refer to FIG. 9 along with FIG. 8 in order to understand of the disclosed pre-distortion method. FIG. 9 is a diagram illustrating a pre-distortion apparatus according to another exemplary embodiment of the present invention. The pre-distortion apparatus 900 includes at least one portion (e.g. a portion or all) of an electronic device. More particularly, the pre-distortion apparatus 900 can be a control circuit such as an integrated circuit (IC) within the electronic device. In another example, the pre-distortion apparatus 900 can be the whole of the electronic device mentioned above. Examples of the electronic device may include, but are not limited to, a mobile phone (e.g. a multifunctional mobile phone), a mobile computer (e.g. tablet computer), a personal digital assistant (PDA), and a personal computer such as a laptop computer.

As shown in FIG. 9, the pre-distortion apparatus 900 includes the receiving unit 402 of FIG. 4 and a pre-distortion unit 904. As mentioned above, the receiving unit 402 is used to execute step 302, i.e. receiving an input data a(n), wherein n denotes a discrete time of a digital signal process. In this embodiment, the input data a(n) is an OFDM data produced by an OFDM process, wherein the OFDM process is widely applied in communication systems, especially in wireless communication systems. It should be noted, however, that the present invention is not limited to wireless communication systems or OFDM systems. The pre-distortion unit 904 includes the adaptive coefficient generating unit 4042, the first look-up unit 4044, and the second look-up unit 4046 of FIG. 4, and further includes a pre-distortion ratio computing unit 9042, a delay unit 9044, a square unit 9046, and a square unit 9048, an adder 9050 and a plurality of multipliers 9052, 9054, 9056. Please note that the modules mentioned in this embodiment are denoted as general purpose, and the specific implementation of each module will be given in embodiments of the following paragraphs. For simplifying the complexity of each embodiment in the following paragraphs, an order of a memory polynomial of a target power amplifier that the pre-distortion unit 904 deals with is 2, and a memory depth is 1; in other words, for equation (1), (2) and (3), p=2 and M=1. The size of the order of the memory polynomial of the power amplifier and the size of the memory depth mentioned above is for illustrative purposes only, however.

In FIG. 9, after the receiving unit 402 transmits the input data a(n) to the pre-distortion unit 904, the input data a(n) goes through a pre-distortion function of the pre-distortion unit 904 and a pre-distorted output x(n) can be obtained. In this embodiment, the pre-distortion process is the exact content of equation (6). Please refer to the deductions associated with equation (1) to equation (8) and the descriptions regarding steps 304 to step 310 for details of building the first look-up unit 4044, and the second look-up unit 4046. The details are omitted here for brevity.

After the adaptive process, the plurality of calculated $|x(n)|^2$ within the specific power level range and the plurality of reciprocals of the corresponding $d_o$ are to be stored in the first look-up table LUT1 of the first look-up unit 4044 for $1/d_0$ of equation (6); and the plurality of calculated $|x(n-1)|^2$ within the specific power level range and the plurality of corresponding $d_1$ are to be stored in a second look-up table LUT2 of the second look-up unit 4046 for $d_i$ of equation (6) (i=1). Then, x(n) can be derived according to equation (6), $$\text{i.e. } x(n) = \frac{1}{d_0}\left[a(n) - \sum_{i=1}^{M} x(n-i)d_i\right],$$

where M=1.

In step 802, the delay unit 9044 is used to delay data for a single time unit, and an output of the delay unit 9044 is denoted as x(n−1). The corresponding $d_1$ can be found in the second look-up table unit 4046 by using $|x(n-1)|^2$ (outputted by the square unit 9048). Then, a first sub-term G can be derived by multiplying x(n−1) and $d_1$, i.e. x(n−1)$d_1$ of equation (6). In step 804, a second sub-term can be derived by searching for a specific first coefficient corresponding to a square value of the input data a(n) from the first look-up table. In step 806, a third sub-term can be obtained by multiplying the input data a(n) with the pre-distortion ratio F. Next, by subtracting the first sub-term $x(n-1)d_1$ from the third sub-term a(n)F, a fourth sub-term can be produced; and by multiplying the fourth sub-term with the second sub-term, the right side of the equal sign of equation (6) can be derived, i.e. $(a(n) F-x(n-1)d_l)/d_0$, which is the desired term in this embodiment.

An alternative architecture can be found by simplifying the pre-distortion apparatus 900 of FIG. 9. Please refer to FIG. 10, which is a diagram illustrating a pre-distortion apparatus according to another exemplary embodiment of the present invention. The pre-distortion apparatus 1200 includes at least one portion (e.g. a portion or all) of an electronic device. More particularly, the pre-distortion apparatus 1200 can be a control circuit such as an integrated circuit (IC) within the electronic device. In another example, the pre-distortion apparatus 1200 can be the whole of the electronic device mentioned above. Examples of the electronic device may include, but are not limited to, a mobile phone (e.g. a multifunctional mobile phone), a mobile computer (e.g. tablet computer), a personal digital assistant (PDA), and a personal computer such as a laptop computer.

Figure 10:
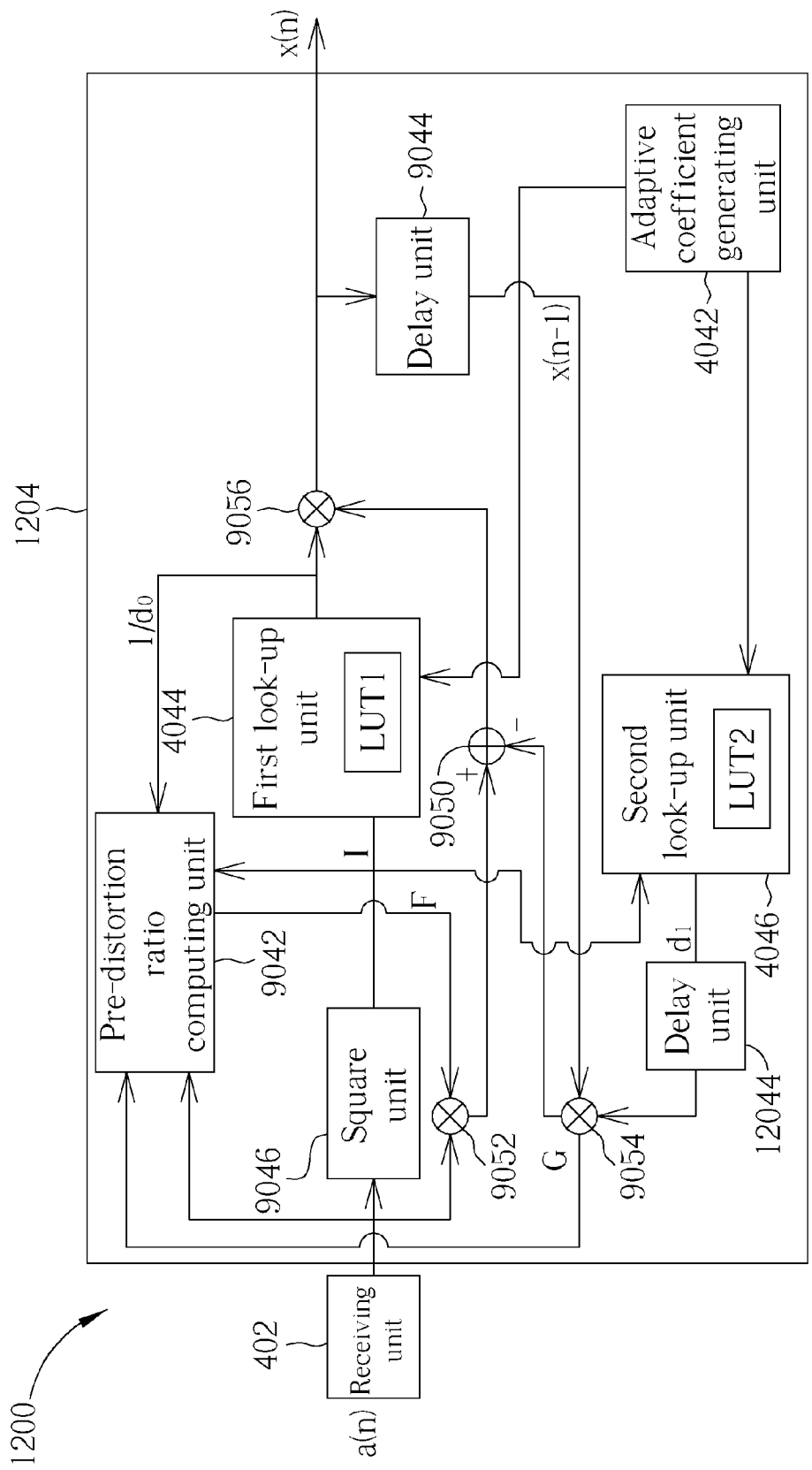
FIG. 10 is a diagram illustrating a pre-distortion apparatus according to another exemplary embodiment of the present invention.

As shown in FIG. 10, the pre-distortion apparatus 1200 includes the receiving unit 402 of FIG. 4 and a pre-distortion unit 1204. As mentioned above, the receiving unit 402 is used to execute step 302, i.e. receiving an input data a(n), wherein n denotes a discrete time of a digital signal process. The pre-distortion unit 1204 includes the adaptive coefficient generating unit 4042, the first look-up unit 4044, and the second look-up unit 4046 of FIG. 4, and a pre-distortion ratio computing unit 9042, a delay unit 9044, a square unit 9046, an adder 9050 and a plurality of multipliers 9052, 9054, 9056 of FIG. 9, and further includes a delay unit 12044. For simplifying the complexity of each embodiment, an order of a memory polynomial of a target power amplifier that the pre-distortion unit 904 deals with is 2, and a memory depth is 1; in other words, for equation (1), (2) and (3), p=2 and M=1. The size of the depth of the memory polynomial of the power amplifier and the size of the memory depth mentioned above is for illustrative purposes only.

The M+1 square units can be simplified to only 1 square unit according to FIG. 10. For example, the two square units 9046, 9048 of FIG. 9 are simplified to become only the square unit 9046 of FIG. 10 in the case where p=2 and M=1. The pre-distortion unit 1204 has to meet the requirements of equation (7), $|x(n)|^2=|a(n)|^2$. At time n, the power of a(n) can be derived by using only one square unit, and the power of a (n) can be further utilized to find out the corresponding $1/d_0$ from the first look-up unit 4044; at time n+1, the power of a(n) can be further utilized to find out the corresponding $d_1$ from the second look-up unit 4046 and so on. The pre-distortion apparatus 1200 not only simplifies the hardware complexity of the pre-distortion apparatus 900, but also quickens the operation speed.

Figure 11:
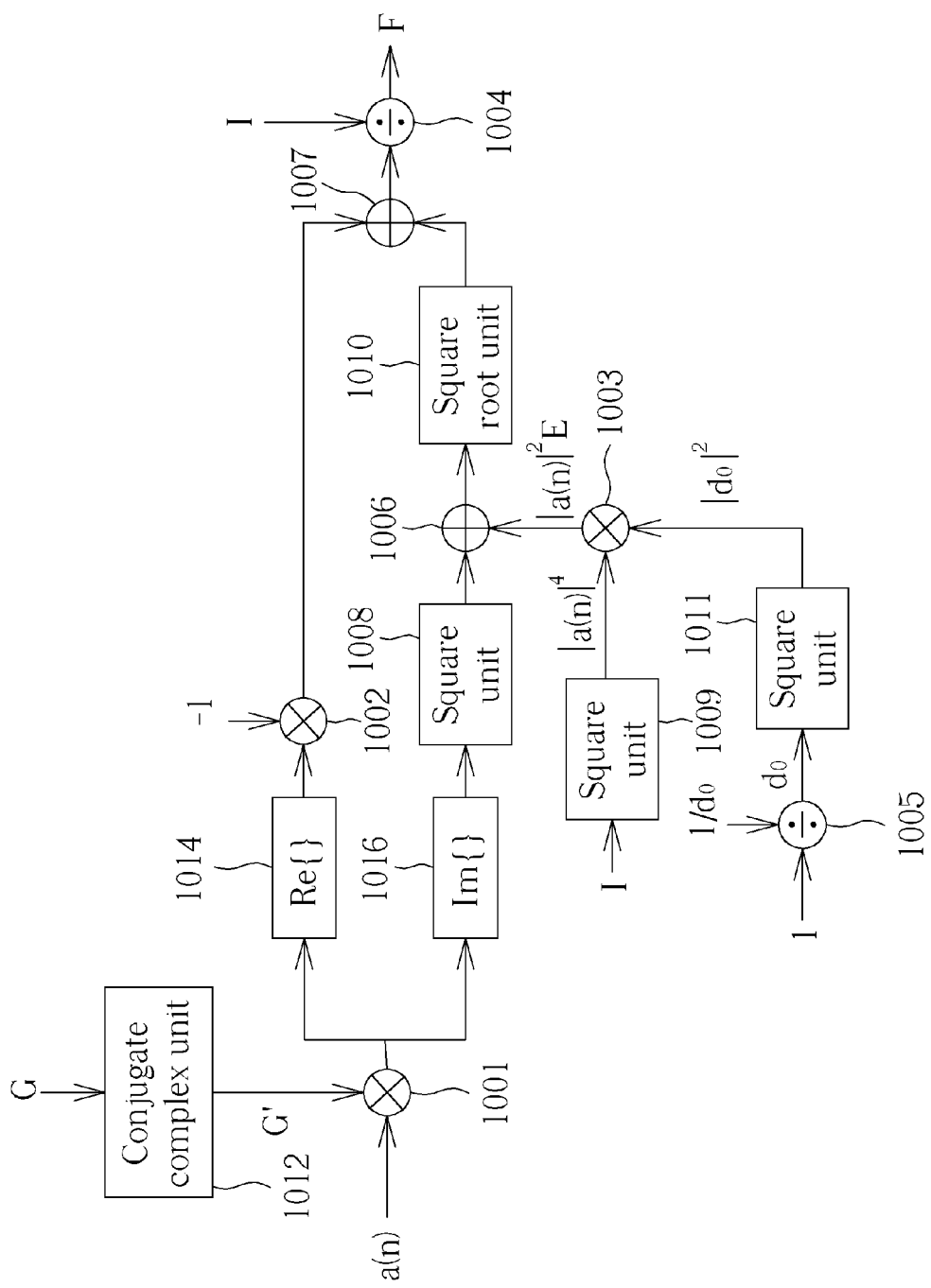
FIG. 11 is a diagram illustrating a pre-distortion ratio computing unit of the pre-distortion apparatus according to an exemplary embodiment of the present invention.

FIG. 11 is a diagram illustrating a pre-distortion ratio computing unit 9042 of the pre-distortion apparatus 900 according to an exemplary embodiment of the present invention. The pre-distortion ratio computing unit 9042 includes a plurality of multipliers 1001~1003, a plurality of dividers 1004~1005, a plurality of adders 100~61007, a conjugate complex unit 1012, a real part unit 1014, an imaginary part unit 1016, a plurality of square units 1008, 1009 and 1011, and a square root unit 1010. According to equation (13), the expression $$F = \frac{-\text{Re}(a(n)G^*) + \sqrt{|a(n)|^2 E - (\text{Im}(a(n)G^*))^2}}{|a(n)|^2}$$

can be derived, where Re(a(n)G*) denotes a real part of a(n)G*, and Im(a(n) G*) denotes an imaginary part of a(n) G*. The conjugate complex unit 1012 can generate G*, and a product of a(n) and G* is then sent to the real part unit 1014 and the imaginary part unit 1016, respectively. The real part of a(n)G* (i.e. Re(a(n)G*)) and the imaginary part of a(n)G* (i.e. Im(a(n)G*)) can be generated from the real part unit 1014 and the imaginary part unit 1016, respectively. Next, $1/d_0$ can be found from the first look-up unit 4044, and $1/d_0$ becomes $|d_0|^2$ through the divider 1005 and the square unit 1011. A product (i.e. $|a(n)|^2E$) can be produced by multiplying $|d_0|^2$ and the output (i.e. $|a(n)|^4$) of the square unit 1009. Through some basic arithmetic operations shown in FIG. 11, F can be derived after the output of the divider 1004.

It should be noted that the contents of the first look-up table LUT1 and the second look-up table LUT2 may be built automatically after powering on the pre-distortion apparatus 400, the pre-distortion apparatus 900 and the pre-distortion apparatus 1200, or the contents may be updated automatically when the environment of the communication system changes. For example, the contents of the first look-up table LUT1 and the second look-up table LUT2 may be built automatically when the channel changes or when the temperature dramatically changes. Please note that this is for illustrative purposes only, and not a limitation of the present invention. The contents of the first look-up table LUT1 and the second look-up table LUT2 may be built automatically whenever a designer considers it necessary based on practice application. The circuits related to the implementation of equation (6) are for illustrative purposes only; any other alternative designs which meet the requirements of equation (6) may also be applied.

Figure 12:
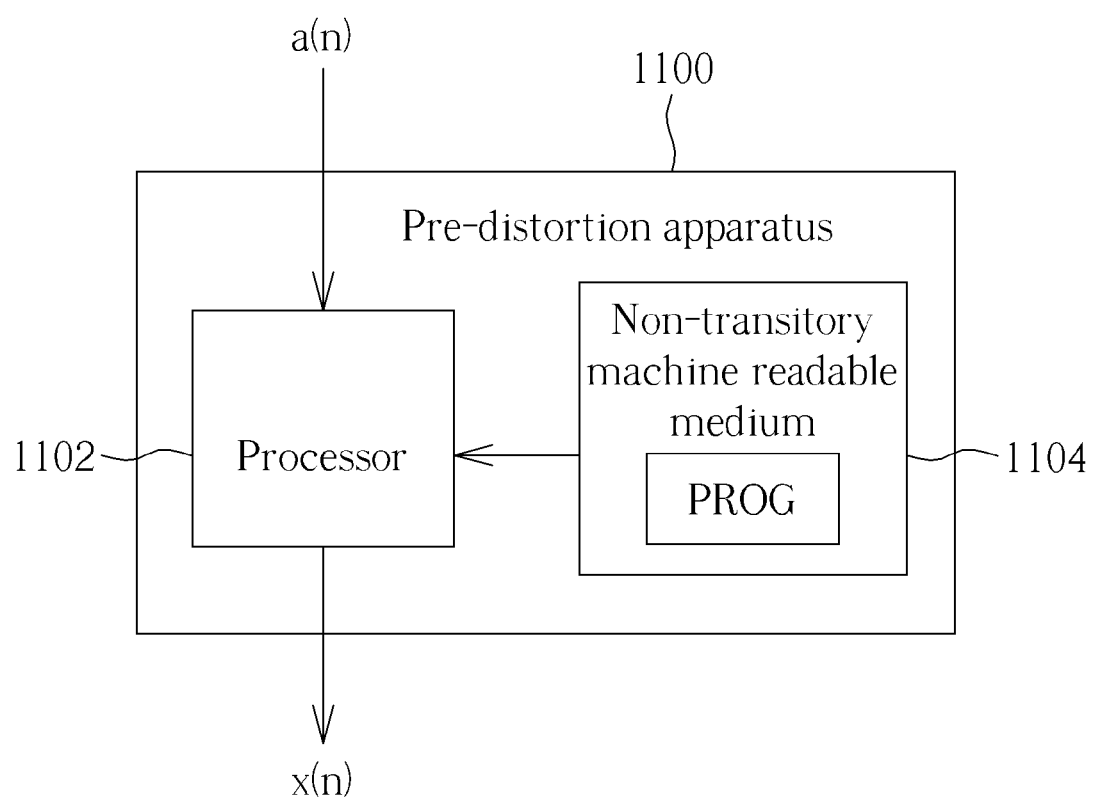
FIG. 12 is a diagram illustrating a pre-distortion apparatus for performing the pre-distortion method according to an exemplary embodiment of the present invention.

Please refer to FIG. 12, which is a diagram illustrating a pre-distortion apparatus 1100 for performing the pre-distortion method mentioned above according to an exemplary embodiment of the present invention. The pre-distortion apparatus 1100 may be a computer system, including a processor 1102 and a non-transitory machine readable medium 1104. The pre-distortion apparatus 1100 could be a personal computer, and the non-transitory machine readable medium 1104 could be any storage device capable of storing data in a personal computer, e.g. a volatile memory, non-volatile memory, hard disk or CD-ROM. In this embodiment, the non-transitory machine readable medium 1104 stores a program code PROG, wherein when the program code PROG is loaded and executed by the processor 1102, the program code PROG enables the processor to perform the pre-distortion method (i.e. the steps 302~310 shown in FIG. 3, the steps 502~508 shown in FIG. 5, and the steps 802~808 shown in FIG. 8) of the present invention. Those skilled in the art will readily understand the operation of the pre-distortion method via the program code PROG executed by the processor 1102 after reading the above paragraphs; further description is therefore omitted here for brevity.

One of the advantages of the present invention is that non-linear characteristics and/or memory effect of a power amplifier in an RF circuit can be compensated via the disclosed methods and apparatus, so that user experience of an electronic device can be improved over the entire bandwidth.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A pre-distortion method, comprising:
receiving an input data;
obtaining a pre-distorted output by inputting the input data into a pre-distortion function, wherein the pre-distortion function is determined according to a following power amplifier;
obtaining a pre-distortion ratio, wherein the pre-distortion ratio is an output of the power amplifier to the input data; and
multiplying a reciprocal of the pre-distortion ratio with the output of the power amplifier;
wherein the step of obtaining the pre-distorted output by inputting the input data into the pre-distortion function comprises:
deriving a plurality of coefficients corresponding to each of a plurality of power levels of the pre-distorted output within a specific power level range by utilizing an adaptive algorithm, wherein the plurality of coefficients includes at least a first coefficient and a second coefficient of a function of the power amplifier;
storing a reciprocal of the at least a first coefficient corresponding to each of the plurality of power levels into a first look-up table;
storing the at least a second coefficient corresponding to each of the plurality of power levels into a second look-up table; and
deriving the pre-distortion function according to the first look-up table and the second look-up table in order to mitigate or cancel unwanted characteristics of the power amplifier.

2. The pre-distortion method of claim 1, wherein the input data is an Orthogonal Frequency Division Multiplexing (OFDM) data.

3. The pre-distortion method of claim 1, wherein the adaptive algorithm is a least mean square (LMS) algorithm.

4. The pre-distortion method of claim 1, wherein the plurality of power levels within the specific power level range is assigned according to a non-linear characteristic of the power amplifier.

5. The pre-distortion method of claim 1, wherein the step of deriving the plurality of coefficients corresponding to each of the plurality of power levels of the pre-distorted output within the specific power level range by utilizing the adaptive algorithm comprises:
generating a test signal which has a specific power level of the plurality of power levels for a finite impulse response (FIR) filter and the power amplifier;
obtaining an FIR filter output at an output terminal of the FIR filter;
controlling the output of the power amplifier to be fed back to an input terminal of an error computing circuit and to be subtracted from the FIR filter output in order to obtain an error term; and
utilizing the error term to perform the adaptive algorithm to optimize the FIR filter and to obtain a plurality of coefficients corresponding to the specific power level of the pre-distorted output.

6. The pre-distortion method of claim 5, wherein contents of the test signal are pseudo random values.

7. The pre-distortion method of claim 6, wherein the step of generating the test signal which has the specific power level of the plurality of power levels comprises:
generating a random value between −1 and 1 in a pseudo random manner, and outputting the random value as an in-phase test signal component;
squaring the in-phase test signal component to obtain a square value of the in-phase test signal component;
adding 1 to a negative number of the square value of the in-phase test signal component to obtain a computing result;
deriving a square root of the computing result;
generating a selection result from −1 and 1 in a pseudo random manner, and multiplying the selection result with the square root to obtain a quadrature-phase test signal component;
adjusting the in-phase test signal component and the quadrature-phase test signal component according to the specific power level of the desired test signal, to further generate a power level adjusted in-phase test signal component and a power level adjusted quadrature-phase test signal component; and
merging the power level adjusted in-phase test signal component with the power level adjusted quadrature-phase test signal component to be output as the test signal.

8. The pre-distortion method of claim 5, wherein the test signal is of a bandwidth which the power amplifier desires to process.

9. The pre-distortion method of claim 1, wherein the step of deriving the pre-distortion function according to the first look-up table and the second look-up table comprises:
deriving a square value of an output of the pre-distortion function at a previous time unit, obtaining a specific second coefficient corresponding to the square value of the output of the pre-distortion function at the previous time unit from the second look-up table, and multiplying the specific second coefficient with the output of the pre-distortion function at the previous time unit to produce a first sub-term;
squaring the input data to obtain a square value of the input data, and obtaining a specific first coefficient corresponding to the square value of the input data from the first look-up table as a second sub-term;
multiplying the input data with the pre-distortion ratio to produce a third sub-term; and
subtracting the first sub-term from the third sub-term to produce a fourth sub-term, and multiplying the fourth sub-term with the second sub-term to produce the pre-distortion function.

10. The pre-distortion method of claim 9, wherein the step of multiplying the input data with the pre-distortion ratio to produce the third sub-term comprises:
multiplying the input data with a conjugate complex of the first sub-term to produce a fifth sub-term;
multiplying a square value of a reciprocal of the specific first coefficient with the input data to the power of 4, to produce a sixth sub-term;
subtracting a square value of an imaginary part of the fifth sub-term from the sixth sub-term, to produce a seventh sub-term;
subtracting a real part of the fifth sub-term from a square root of the seventh sub-term, to produce an eighth sub-term; and dividing the eighth sub-term by a square value of the input data to produce the pre-distortion ratio, and multiplying the input data with the pre-distortion ratio to produce the third sub-term.

11. The pre-distortion method of claim 1, wherein the step of deriving the pre-distortion function according to the first look-up table and the second look-up table comprises:
   obtaining a specific second coefficient corresponding to a square value of the input data from the second look-up table, and multiplying the specific second coefficient at the previous time unit with the output of the pre-distortion function at the previous time unit to produce a first sub-term;
   obtaining a specific first coefficient corresponding to the square value of the input data from the first look-up table as a second sub-term;
   multiplying the input data with the pre-distortion ratio to produce a third sub-term; and
   subtracting the first sub-term from the third sub-term to produce a fourth sub-term, and multiplying the fourth sub-term with the second sub-term to produce the pre-distortion function.

12. The pre-distortion method of claim 11, wherein the step of multiplying the input data with the pre-distortion ratio to produce the third sub-term comprises:
   multiplying the input data with a conjugate complex of the first sub-term to produce a fifth sub-term;
   multiplying a square value of a reciprocal of the specific first coefficient with the input data to the power of 4, to produce a sixth sub-term;
   subtracting a square value of an imaginary part of the fifth sub-term from the sixth sub-term, to produce a seventh sub-term;
   subtracting a real part of the fifth sub-term from a square root of the seventh sub-term, to produce an eighth sub-term; and
   dividing the eighth sub-term by a square value of the input data to produce the pre-distortion ratio, and multiplying the input data with the pre-distortion ratio to produce the third sub-term.

13. A pre-distortion apparatus, comprising:
   a receiving circuitry, arranged for receiving an input data;
   a pre-distortion circuitry, arranged for obtaining a pre-distorted output by inputting the input data into a pre-distortion function, wherein the pre-distortion function is determined according to a following power amplifier, and for obtaining a pre-distortion ratio, wherein the pre-distortion ratio is an output of the power amplifier to the input data; and
   a gain compensation circuitry, for multiplying a reciprocal of the pre-distortion ratio with the output of the power amplifier;
   wherein the pre-distortion circuitry comprises:
      an adaptive coefficient generating circuitry, arranged for deriving a plurality of coefficients corresponding to each of a plurality of power levels of the pre-distorted output within a specific power level range by utilizing an adaptive algorithm, wherein the plurality of coefficients includes at least a first coefficient and a second coefficient of a function of the power amplifier;
      a first look-up circuitry, possessing a first look-up table, wherein the first look-up table stores a reciprocal of the at least a first coefficient corresponding to each of the plurality of power levels into a first look-up table;
      a second look-up circuitry, possessing a second look-up table, wherein the second look-up table stores the at least a second coefficient corresponding to each of the plurality of power levels into a second look-up table; and
      an arithmetic circuitry, arranged for deriving the pre-distortion function according to the first look-up table and the second look-up table in order to mitigate or cancel unwanted characteristics of the power amplifier.

14. The pre-distortion apparatus of claim 13, wherein the input data is an Orthogonal Frequency Division Multiplexing (OFDM) data.

15. The pre-distortion apparatus of claim 13, wherein the adaptive algorithm is a least mean square (LMS) algorithm.

16. The pre-distortion apparatus of claim 13, wherein the plurality of power levels within the specific power level range is assigned according to a non-linear characteristic of the power amplifier.

17. The pre-distortion apparatus of claim 13, wherein the adaptive coefficient generating circuitry comprises:
   a test signal generating circuitry, arranged for generating a test signal which has a specific power level of the plurality of power levels for a finite impulse response (FIR) filter and the power amplifier;
   the FIR filter, arranged for obtaining an FIR filter output at an output terminal of the FIR filter;
   an error computing circuit, arranged for controlling the output of the power amplifier to be fed back to an input terminal of the error computing circuit and to be subtracted from the FIR filter output to obtain an error term; and
   an adaptive processing circuitry, arranged for utilizing the error term to perform the adaptive algorithm to optimize the FIR filter and to obtain a plurality of coefficients corresponding to the specific power level of the pre-distorted output.

18. The pre-distortion apparatus of claim 17, wherein contents of the test signal are pseudo random values.

19. The pre-distortion apparatus of claim 18, wherein the test signal generating circuitry comprises:
   a first pseudo random number generator, arranged for generating a random value between −1 and 1 in a pseudo random manner, and outputting the random value as an in-phase test signal component;
   a square circuitry, arranged for squaring the in-phase test signal component to obtain a square value of the in-phase test signal component;
   an adder, arranged for adding 1 to a negative number of the square value of the in-phase test signal component to obtain a computing result;
   a square root circuitry, arranged for deriving a square root of the computing result;
   a second pseudo random number generator, arranged for generating a selection result from −1 and 1 in a pseudo random manner, and multiplying the selection result with the square root to obtain a quadrature-phase test signal component;
   a power level control circuitry, arranged for adjusting the in-phase test signal component and the quadrature-phase test signal component according to the specific power level of the desired test signal, to further generate a power level adjusted in-phase test signal component and a power level adjusted quadrature-phase test signal component; and
   a signal merging circuitry, arranged for merging the power level adjusted in-phase test signal component with the power level adjusted quadrature-phase test signal component to output as the test signal.

20. The pre-distortion apparatus of claim 17, wherein the test signal is of a bandwidth which the power amplifier desires to process.

21. The pre-distortion apparatus of claim 13, wherein the arithmetic circuitry comprises:
a first sub-arithmetic circuitry, arranged for deriving a square value of an output of the pre-distortion function at a previous time unit, obtaining a specific second coefficient corresponding to the square value of the output of the pre-distortion function at the previous time unit from the second look-up table, and multiplying the specific second coefficient with the output of the pre-distortion function at the previous time unit to produce a first sub-term;
a second sub-arithmetic circuitry, arranged for squaring the input data to obtain a square value of the input data, and obtaining a specific first coefficient corresponding to the square value of the input data from the first look-up table as a second sub-term;
a third sub-arithmetic circuitry, arranged for multiplying the input data with the pre-distortion ratio to produce a third sub-term; and
a fourth sub-arithmetic circuitry, arranged for subtracting the first sub-term from the third sub-term to produce a fourth sub-term, and multiplying the fourth sub-term with the second sub-term to produce the pre-distortion function.

22. The pre-distortion apparatus of claim 21, wherein the third sub-arithmetic circuitry comprises:
a fifth sub-arithmetic circuitry, arranged for multiplying the input data with a conjugate complex of the first sub-term to produce a fifth sub-term;
a sixth sub-arithmetic circuitry, arranged for multiplying a square value of a reciprocal of the specific first coefficient with the input data to the power of 4, to produce a sixth sub-term;
a seventh sub-arithmetic circuitry, arranged for subtracting a square value of an imaginary part of the fifth sub-term from the sixth sub-term, to produce a seventh sub-term;
an eighth sub-arithmetic circuitry, arranged for subtracting a real part of the fifth sub-term from a square root of the seventh sub-term, to produce an eighth sub-term; and
a ninth sub-arithmetic circuitry, arranged for dividing the eighth sub-term by a square value of the input data to produce the pre-distortion ratio, and multiplying the input data with the pre-distortion ratio to produce the third sub-term.

23. The pre-distortion apparatus of claim 13, wherein the arithmetic circuitry comprises:
a first sub-arithmetic circuitry, arranged for obtaining a specific second coefficient corresponding to a square value of the input data from the second look-up table, and multiplying the specific second coefficient at the previous time unit with the output of the pre-distortion function at the previous time unit to produce a first sub-term;
a second sub-arithmetic circuitry, arranged for obtaining a specific first coefficient corresponding to the square value of the input data from the first look-up table as a second sub-term;
a third sub-arithmetic circuitry, arranged for multiplying the input data with the pre-distortion ratio to produce a third sub-term; and
a fourth sub-arithmetic circuitry, arranged for subtracting the first sub-term from the third sub-term to produce a fourth sub-term, and multiplying the fourth sub-term with the second sub-term to produce the pre-distortion function.

24. The pre-distortion apparatus of claim 23, wherein the third sub-arithmetic circuitry comprises:
a fifth sub-arithmetic circuitry, arranged for multiplying the input data with a conjugate complex of the first sub-term to produce a fifth sub-term;
a sixth sub-arithmetic circuitry, arranged for multiplying a square value of a reciprocal of the specific first coefficient with the input data to the power of 4, to produce a sixth sub-term;
a seventh sub-arithmetic circuitry, arranged for subtracting a square value of an imaginary part of the fifth sub-term from the sixth sub-term, to produce a seventh sub-term;
an eighth sub-arithmetic circuitry, arranged for subtracting a real part of the fifth sub-term from a square root of the seventh sub-term, to produce an eighth sub-term; and
a ninth sub-arithmetic circuitry, arranged for dividing the eighth sub-term by a square value of the input data to produce the pre-distortion ratio, and multiplying the input data with the pre-distortion ratio to produce the third sub-term.

25. A non-transitory machine readable medium storing a program code, wherein when executed by a processor, the program code enables the processor to perform a pre-distortion method, the method comprising:
receiving an input data;
obtaining a pre-distorted output by inputting the input data into a pre-distortion function, wherein the pre-distortion function is determined according to a following power amplifier;
obtaining a pre-distortion ratio, wherein the pre-distortion ratio is an output of the power amplifier to the input data; and
multiplying a reciprocal of the pre-distortion ratio with the output of the power amplifier;
wherein the step of obtaining the pre-distorted output by inputting the input data into the pre-distortion function, wherein the pre-distortion function is determined according to the following power amplifier comprises:
deriving a plurality of coefficients corresponding to each of a plurality of power levels of the pre-distorted output within a specific power level range by utilizing an adaptive algorithm, wherein the plurality of coefficients includes at least a first coefficient and a second coefficient of a function of the power amplifier;
storing a reciprocal of the at least a first coefficient corresponding to each of the plurality of power levels into a first look-up table;
storing the at least a second coefficient corresponding to each of the plurality of power levels into a second look-up table; and
deriving the pre-distortion function according to the first look-up table and the second look-up table in order to mitigate or cancel unwanted characteristics of the power amplifier.

26. The non-transitory machine readable medium of claim 25, wherein the input data is an Orthogonal Frequency Division Multiplexing (OFDM) data.

27. The non-transitory machine readable medium of claim 25, wherein the adaptive algorithm is a least mean square (LMS) algorithm.

28. The non-transitory machine readable medium of claim 25, wherein the plurality of power levels within the specific power level range is assigned according to a non-linear characteristic of the power amplifier.

29. The non-transitory machine readable medium of claim 25, wherein the step of deriving the plurality of coefficients corresponding to each of the plurality of power levels of the pre-distorted output within the specific power level range by utilizing the adaptive algorithm comprises:
generating a test signal which has a specific power level of the plurality of power levels for a finite impulse response (FIR) filter and the power amplifier;
obtaining an FIR filter output at an output terminal of the FIR filter;
controlling the output of the power amplifier to be fed back to an input terminal of an error computing circuit and to be subtracted from the FIR filter output to obtain an error term; and
utilizing the error term to perform the adaptive algorithm to optimize the FIR filter and to obtain a plurality of coefficients of the pre-distorted output corresponding to the specific power level.

30. The non-transitory machine readable medium of claim 29, wherein contents of the test signal are pseudo random values.

31. The non-transitory machine readable medium of claim 30, wherein the step of generating the test signal which has the specific power level of the plurality of power levels comprises:
generating a random value between −1 and 1 in a pseudo random manner, and outputting the random value as an in-phase test signal component;
squaring the in-phase test signal component to obtain a square value of the in-phase test signal component;
adding 1 to a negative number of the square value of the in-phase test signal component to obtain a computing result;
deriving a square root of the computing result;
generating a selection result from −1 and 1 in a pseudo random manner, and multiplying the selection result with the square root to obtain a quadrature-phase test signal component;
adjusting the in-phase test signal component and the quadrature-phase test signal component according to the specific power level of the desired test signal, to further generate a power level adjusted in-phase test signal component and a power level adjusted quadrature-phase test signal component; and
merging the power level adjusted in-phase test signal component with the power level adjusted quadrature-phase test signal component to be output as the test signal.

32. The non-transitory machine readable medium of claim 29, wherein the test signal is of a bandwidth which the power amplifier desires to process.

33. The non-transitory machine readable medium of claim 25, wherein the step of deriving the pre-distortion function according to the first look-up table and the second look-up table comprises:
deriving a square value of an output of the pre-distortion function at a previous time unit, and obtaining a specific second coefficient corresponding to the square value of the output of the pre-distortion function at the previous time unit from the second look-up table, and multiplying the specific second coefficient with the output of the pre-distortion function at the previous time unit to produce a first sub-term;
squaring the input data to obtain a square value of the input data, and obtaining a specific first coefficient corresponding to the square value of the input data from the first look-up table as a second sub-term;
multiplying the input data with the pre-distortion ratio to produce a third sub-term; and
subtracting the first sub-term from the third sub-term to produce a fourth sub-term, and multiplying the fourth sub-term with the second sub-term to produce the pre-distortion function.

34. The non-transitory machine readable medium of claim 33, wherein the step of multiplying the input data with the pre-distortion ratio to produce the third sub-term comprises:
multiplying the input data with a conjugate complex of the first sub-term to produce a fifth sub-term;
multiplying a square value of a reciprocal of the specific first coefficient with the input data to the power of 4, to produce a sixth sub-term;
subtracting a square value of an imaginary part of the fifth sub-term from the sixth sub-term, to produce a seventh sub-term;
subtracting a real part of the fifth sub-term from a square root of the seventh sub-term, to produce an eighth sub-term; and
dividing the eighth sub-term by a square value of the input data to produce the pre-distortion ratio, and multiplying the input data with the pre-distortion ratio to produce the third sub-term.

35. The non-transitory machine readable medium of claim 25, wherein the step of deriving the pre-distortion function according to the first look-up table and the second look-up table comprises:
obtaining a specific second coefficient corresponding to a square value of the input data from the second look-up table, and multiplying the specific second coefficient at the previous time unit with the output of the pre-distortion function at the previous time unit to produce a first sub-term;
obtaining a specific first coefficient corresponding to the square value of the input data from the first look-up table as a second sub-term;
multiplying the input data with the pre-distortion ratio to produce a third sub-term; and
subtracting the first sub-term from the third sub-term to produce a fourth sub-term, and multiplying the fourth sub-term with the second sub-term to produce the pre-distortion function.

36. The non-transitory machine readable medium of claim 35, wherein the step of multiplying the input data with the pre-distortion ratio to produce the third sub-term comprises:
multiplying the input data with a conjugate complex of the first sub-term to produce a fifth sub-term;
multiplying a square value of a reciprocal of the specific first coefficient with the input data to the power of 4, to produce a sixth sub-term;
subtracting a square value of an imaginary part of the fifth sub-term from the sixth sub-term, to produce a seventh sub-term;
subtracting a real part of the fifth sub-term from a square root of the seventh sub-term, to produce an eighth sub-term; and
dividing the eighth sub-term by a square value of the input data to produce the pre-distortion ratio, and multiplying the input data with the pre-distortion ratio to produce the third sub-term.

* * * * *